United States Patent
Inoue et al.

(10) Patent No.: US 10,505,514 B2
(45) Date of Patent: Dec. 10, 2019

(54) PIEZOELECTRIC THIN FILM AND BULK ACOUSTIC WAVE FILTER

(71) Applicant: SnapTrack, Inc., San Diego, CA (US)

(72) Inventors: Yukari Inoue, Tokyo (JP); Tomohiro Terada, Tokyo (JP); Junichi Kimura, Tokyo (JP)

(73) Assignee: QUALCOMM Incorporated, San Diego, CA (US)

(*) Notice: Subject to any disclaimer, the term of this patent is extended or adjusted under 35 U.S.C. 154(b) by 115 days.

(21) Appl. No.: 15/950,583

(22) Filed: Apr. 11, 2018

(65) Prior Publication Data

US 2019/0319604 A1 Oct. 17, 2019

(51) Int. Cl.
| | |
|---|---|
| H03H 9/02 | (2006.01) |
| H03H 9/56 | (2006.01) |
| H03H 9/17 | (2006.01) |
| H03H 9/205 | (2006.01) |
| H03H 9/58 | (2006.01) |
| H01L 41/187 | (2006.01) |
| H01L 41/18 | (2006.01) |
| H03H 9/05 | (2006.01) |

(52) U.S. Cl.
CPC ....... *H03H 9/02031* (2013.01); *H01L 41/187* (2013.01); *H03H 9/175* (2013.01); *H03H 9/205* (2013.01); *H03H 9/562* (2013.01); *H03H 9/564* (2013.01); *H03H 9/589* (2013.01); *H01L 41/18* (2013.01); *H03H 9/0504* (2013.01)

(58) Field of Classification Search
CPC .......... H03H 9/02015; H03H 9/02031; H03H 9/0504; H03H 9/205; H03H 9/175; H03H 9/562; H03H 9/564; H03H 9/589; H01L 41/18; H01L 41/187
USPC .................................................. 333/187, 189
See application file for complete search history.

(56) References Cited

U.S. PATENT DOCUMENTS

| | | | | |
|---|---|---|---|---|
| 8,747,552 | B2* | 6/2014 | Slack | C30B 23/00 117/81 |
| 9,374,060 | B2* | 6/2016 | Onda | H03H 9/175 |
| 2013/0241673 | A1* | 9/2013 | Yokoyama | H03H 9/02015 333/189 |
| 2015/0357555 | A1* | 12/2015 | Umeda | H01L 41/316 310/322 |
| 2018/0026604 | A1* | 1/2018 | Yokoyama | H01L 41/0472 333/133 |

* cited by examiner

*Primary Examiner* — Barbara Summons
(74) *Attorney, Agent, or Firm* — Qualcomm Incorporated

(57) ABSTRACT

A piezoelectric thin film comprises aluminum nitride containing a monad and at least one type among a tetrad and a pentad. The piezoelectric thin film having a large electromechanical coupling factor and a small stiffness.

10 Claims, 2 Drawing Sheets

| TABLE 1 | CHEMICAL FORMULA 1: $Al_{1-x}(L_yM_{1-y})_xN$ | | | | $d_{33}$ | $g_{33}$ | $k_{eff}^2$ | $k^2$ | STIFFNESS c | RESISTANCE TO COMPRESSIVE STRESS |
|---|---|---|---|---|---|---|---|---|---|---|
| | L | M | x | y | (1-y)/y | [pC/N] | [$10^{-3}$Vm/N] | [%] | [%] | [GPa] | |
| WORKING EXAMPLE 1 | Li | Nb | 0.12 | 0.50 | 1.00 | 5.1 | 54 | 9.4 | 7.5 | 341 | A |
| WORKING EXAMPLE 2 | Li | Ta | 0.12 | 0.50 | 1.00 | 4.9 | 53 | 9.0 | 7.4 | 347 | A |
| WORKING EXAMPLE 3 | Li | V | 0.12 | 0.50 | 1.00 | 4.7 | 48 | 8.1 | 6.7 | 352 | A |
| WORKING EXAMPLE 4 | Li | Nb | 0.24 | 0.50 | 1.00 | 6.9 | 65 | 13.1 | 11.2 | 293 | A |
| WORKING EXAMPLE 5 | Li | Zr | 0.18 | 0.33 | 2.03 | 4.8 | 51 | 8.1 | 6.8 | 331 | A |
| WORKING EXAMPLE 6 | Li | $Nb_{0.5}Zr_{0.5}$ | 0.12 | 0.40 | 1.50 | 4.9 | 52 | 8.3 | 8.3 | 335 | A |
| COMPARATIVE EXAMPLE 1 | - | - | 0.00 | 0.00 | - | 4.0 | 47 | 7.4 | 6.3 | 403 | B |
| COMPARATIVE EXAMPLE 2 | (Mg) | Zr | 0.12 | 0.50 | 1.00 | 4.7 | 53 | 9.4 | 7.4 | 379 | B |
| COMPARATIVE EXAMPLE 3 | Li | - | 0.12 | 1.00 | 0.00 | - | - | - | - | - | - |
| COMPARATIVE EXAMPLE 4 | - | Nb | 0.12 | 0.00 | - | - | - | - | - | - | - |

TABLE 1

| | CHEMICAL FORMULA 1: $Al_{1-x}(L_yM_{1-y})_xN$ | | | | | $d_{33}$ [pC/N] | $g_{33}$ [$10^{-3}$Vm/N] | $k_{eff}^2$ [%] | $k^2$ [%] | STIFFNESS c [GPa] | RESISTANCE TO COMPRESSIVE STRESS |
| --- | --- | --- | --- | --- | --- | --- | --- | --- | --- | --- | --- |
| | L | M | x | y | (1-y)/y | | | | | | |
| WORKING EXAMPLE 1 | Li | Nb | 0.12 | 0.50 | 1.00 | 5.1 | 54 | 9.4 | 7.5 | 341 | A |
| WORKING EXAMPLE 2 | Li | Ta | 0.12 | 0.50 | 1.00 | 4.9 | 53 | 9.0 | 7.4 | 347 | A |
| WORKING EXAMPLE 3 | Li | V | 0.12 | 0.50 | 1.00 | 4.7 | 48 | 8.1 | 6.7 | 352 | A |
| WORKING EXAMPLE 4 | Li | Nb | 0.24 | 0.50 | 1.00 | 6.9 | 65 | 13.1 | 11.2 | 293 | A |
| WORKING EXAMPLE 5 | Li | Zr | 0.18 | 0.33 | 2.03 | 4.8 | 51 | 8.1 | 6.8 | 331 | A |
| WORKING EXAMPLE 6 | Li | $Nb_{0.5}Zr_{0.5}$ | 0.12 | 0.40 | 1.50 | 4.9 | 52 | 8.3 | 8.3 | 335 | A |
| COMPARATIVE EXAMPLE 1 | - | - | 0.00 | 0.00 | - | 4.0 | 47 | 7.4 | 6.3 | 403 | B |
| COMPARATIVE EXAMPLE 2 | (Mg) | Zr | 0.12 | 0.50 | 1.00 | 4.7 | 53 | 9.4 | 7.4 | 379 | B |
| COMPARATIVE EXAMPLE 3 | Li | - | 0.12 | 1.00 | 0.00 | - | - | - | - | - | - |
| COMPARATIVE EXAMPLE 4 | - | Nb | 0.12 | 0.00 | - | - | - | - | - | - | - |

FIG. 3

PIEZOELECTRIC THIN FILM AND BULK ACOUSTIC WAVE FILTER

BACKGROUND

Field

The present disclosure relates to a piezoelectric thin film and a bulk acoustic wave filter.

Background

In recent years, mobile communication devices have become more compact, and the frequencies used in mobile communication devices have become higher. Accordingly, there is a demand to miniaturize the electronic parts mounted on mobile communication devices, to reduce the number of electronic parts that are mounted, and to adapt the electronic parts to high frequencies.

A duplexer is one known type of electronic part that is mounted in mobile communication devices, such as smart phones. Since mobile communication devices share a single antenna for both transmission and reception, transmission and reception signals are switched by a duplexer. A duplexer includes a transmission filter, which allows transmission signals to pass and blocks reception signals, and a reception filter, which allows reception signals to pass and blocks transmission signals. Conventionally, surface acoustic wave (SAW) filters have been used for these filters. In order to adapt a SAW filter to the frequency of a signal, the width and spacing of the interdigital transducer formed on the surface of a piezoelectric thin film is adjusted. In the case of a SAW filter that accommodates high frequencies, the width and spacing of the interdigital transducer must be made narrow. However, narrowing the width and spacing of the interdigital transducer involves technical problems, and it has not been easy to produce a surface acoustic wave filter that accommodates high frequencies of 2 GHz or higher.

In recent years bulk acoustic wave filters, which utilize bulk acoustic waves (BAW) propagating in the thickness direction of a piezoelectric film, have attracted attention as a substitute for SAW filters. In the case of a BAW filter, the frequency to be accommodated is varied by varying the thickness of the piezoelectric thin film. By making the piezoelectric thin film thin, a BAW filter that accommodates high frequencies of 2 GHz or higher can be easily produced. In response to the miniaturization of mobile communication devices in recent years, there has been a demand for the miniaturization of BAW filters and a reduction in the number of parts thereof. In order to reduce the number of parts, the passband for each BAW filter should be expanded. The passband of a BAW filter strongly depends on the electromechanical coupling factor of the piezoelectric thin film. Examples of known types of piezoelectric thin films used in BAW filters include aluminum nitride (AlN) and zinc oxide (ZnO).

In recent years research has been conducted on methods for improving the piezoelectric effect of AlN by replacing a portion of the aluminum constituting AlN with another element. For example, one method replaced aluminum with scandium (Sc). Scandium, however, is expensive, and the resulting cost of a BAW made with scandium is high. Another method replaced aluminum with a dyad and a tetrad, or a dyad and a pentad. These resulting piezoelectric thin films fail to achieve both a large electromechanical coupling factor and a small stiffness. Stiffness refers to the stiffness constant c in the formula $T = c \cdot S$, where $T$ is the stress acting on a piezoelectric thin film, and $S$ is the strain of the piezoelectric thin film. The units of stiffness may be, for example, Pa or $N/m^2$. A larger stiffness means that the piezoelectric thin film is harder and that a larger stress acts on the piezoelectric thin film more easily. As a result, during or after the formation of the piezoelectric thin film, the piezoelectric thin film may break easily or separate easily from other components, such as the substrate or electrodes. In order to suppress the damage and separation of the piezoelectric thin film caused by stress, a piezoelectric thin film having a small stiffness and increased flexibility desired.

SUMMARY

A piezoelectric thin film may include aluminum nitride containing a monad and at least one type from among a tetrad and a pentad.

A bulk acoustic wave filter may include a substrate, a piezoelectric thin film, and a pair of electrodes. The piezoelectric thin film is disposed on the substrate and between the pair of electrodes. The piezoelectric thin film may include aluminum nitride containing a monad and at least one type from among a tetrad and a pentad.

This has outlined, rather broadly, the features and technical advantages of the present disclosure that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It is to be expressly understood that each of the figures is provided for the purpose of illustration and description only and is not intended as a definition of the limits of the present disclosure.

BRIEF DESCRIPTION OF THE DRAWINGS

FIG. 3 is a table comparing various working examples and comparative examples of piezoelectric thin films and BAW filters made in according with aspects of the present disclosure.

DETAILED DESCRIPTION

Figure 1:
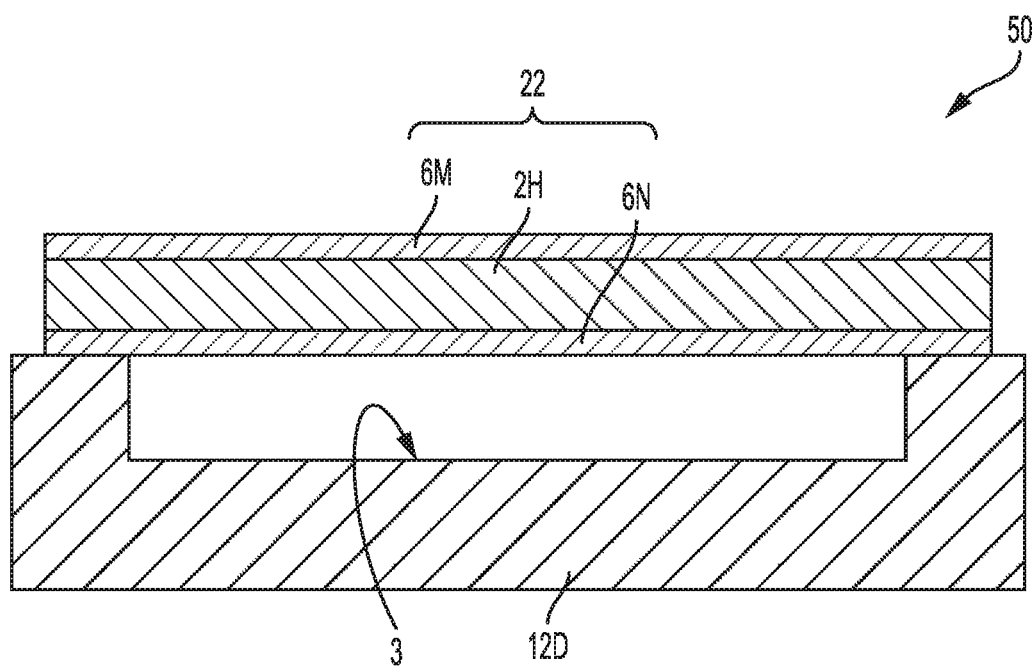
FIG. 1 is a cross-sectional view of a bulk acoustic wave (BAW) filter including a piezoelectric thin film according to aspects of the present disclosure.

According to the present disclosure, a piezoelectric thin film having a large electromechanical coupling and a small stiffness, and a BAW filter including the piezoelectric thin film are disclosed.

Preferred embodiments of the present disclosure will be described hereinafter with reference to the drawings as necessary. The present disclosure is in no way limited to the embodiments described below. In the drawings, identical or equivalent components are labeled with the same reference numerals.

FIG. 1 illustrates a cross-sectional view of a bulk acoustic wave (BAW) filter 50. The BAW filter 50 may be a film bulk acoustic resonator (FBAR) filter. The BAW filter 50 includes a pair of electrodes, first electrode 6M and second electrode 6N, and a piezoelectric thin film 2H disposed between the pair of electrodes 6M and 6N. A laminate 22, composed of the first electrode 6M, the piezoelectric thin film 2H, and the second electrode 6N, is mounted on the surface of a substrate 12D. The BAW filter 50 includes the substrate 12D, the second electrode 6N mounted on the surface of the substrate 12D, the piezoelectric thin film 2H on the second electrode 6N, and the first electrode 6M on the piezoelectric thin film 2H. A cavity or gap 3 is provided between part of the surface of the substrate 12D and the second electrode 6N. The cavity may be covered by the second electrode 6N. The first electrode 6M may overlap with part or all of one surface of the piezoelectric thin film 2H. The first electrode 6M may also directly overlap with the piezoelectric thin film 2H. The second electrode 6N may also directly overlap with the piezoelectric thin film 2H. The BAW filter 50 utilizes the thickness longitudinal vibration of the piezoelectric thin film 2H to allow only signals of a prescribed frequency band to pass while blocking signals of other frequencies. For example, the BAW filter 50 may be used as a radio frequency (RF) filter that operates at 800 MHz to 2,500 MHz.

The piezoelectric thin film 2H includes aluminum nitride (AlN) containing a monad and at least one type from among a tetrad and a pentad. A conventional aluminum nitride crystal, represented by AlN, has a hexagonal wurtzite structure. In this embodiment, a portion of the Al forming the wurtzite structure of AlN is replaced with a monad and at least one type from among a tetrad and a pentad. The monad, tetrad and pentad differ from Al in terms of the iconic radius or electronegativity. Therefore, by replacing a portion of the Al in AlN with a monad and at least one type from among a tetrad and a pentad, the crystal structure of the aluminum nitride is distorted, and the strength of the chemical bonds between the atoms in the crystal structure changes. As a result, the BAW filter 50 according to aspects of the present disclosure has a greater electromagnetic coupling factor $k_{eff}^2$ or $k^2$ than a BAW filter including a piezoelectric thin film made of conventional AlN. In addition, the stiffness of the piezoelectric thin film 2H included in the BAW filter 50 according to this embodiment is smaller than the stiffness of a piezoelectric thin film made of conventional AlN.

The aluminum nitride according to this embodiment is represented by the following chemical formula $Al_{1-x}(L_y M_{1-y})_x N$, where L is at least one type of monad, M is at least one type from among a tetrad and a pentad, x is greater than 0 and less than 1, and y is greater than 0 and less than 1.

M may be one type of tetrad. M may also be a plurality of types of tetrads. M may also be one type of pentad, or a plurality of types of pentads. M may also be one type of tetrad and a plurality of types of pentads, or a plurality of types of tetrads and one type of pentad. M may also be a plurality of types of tetrads and a plurality of types of pentads.

The monad L may be an element having a valence of 1. For example, the monad L may be a Group I element, an alkali metal from the period table. The monad L may also be an element other than a Group I element, for example, silver (Ag). The monad L may also be selected from the group including lithium (Li), sodium (Na), potassium (K), rubidium (Rb), and cesium (Cs). The aluminum nitride may contain at least lithium and/or sodium as the monad L. When the aluminum nitride contains at least lithium or sodium as the monad L, the electromechanical coupling factor tends to be greater and the stiffness tends to be smaller than for conventional AlN.

The tetrad M may be an element having a valence of 4. For example, the tetrad M may be a Group IV element from the periodic table. The tetrad M may also be an element other than a Group IV element, for example, germanium (Ge) or tin (Sn). The tetrad M may be selected from the group including of titanium (Ti), zirconium (Zr), and hafnium (Hf). The aluminum nitride may contain at least zirconium and/or hafnium as the tetrad M. When the aluminum nitride contains at least zirconium or hafnium as the tetrad M, the electromechanical coupling factor tends to be greater and the stiffness tends to be smaller than when the aluminum nitride does not contain a tetrad.

The pentad M may also be an element having a valence of 5. For example, the pentad M may be a Group V element from the periodic table. The pentad M may also be an element other than a Group V element, for example, bismuth (Bi) or antimony (Sb). The pentad M may also be selected from the group including vanadium (V), niobium (Nb), and tantalum (Ta). When the aluminum nitride contains at least one of vanadium (V), niobium (Nb), and tantalum (Ta) as the pentad M, the electromechanical coupling factor tends to be greater and the stiffness tends to be smaller than for conventional AlN.

The aluminum nitride may contain a monad and a pentad, wherein the monad may be lithium and the pentad may be niobium. The aluminum nitride may contain a monad and a pentad, wherein the monad may be sodium and the pentad may be niobium. The aluminum nitride may contain a monad and a pentad, wherein the monad may be lithium and the pentad may be tantalum. The aluminum nitride may contain a monad and a pentad, wherein the monad may be lithium and the pentad may be vanadium. The aluminum nitride may contain a monad and a tetrad, wherein the monad may be lithium and the tetrad may be zirconium. The aluminum nitride may contain a monad, a tetrad, and a pentad, wherein the monad may be lithium, the tetrad may be zirconium, and the pentad may be niobium. When the aluminum nitride contains a combination of the elements described above, the electromechanical coupling factor tends to be greater and the stiffness tends to be smaller than for conventional AlN.

When the aluminum nitride is represented by $Al_{1-x}(L_y M_{1-y})_x N$, y is preferably between 0.20 and 0.60 or between 0.33 and 0.50. When y is within this range, a charge balance is achieved between L and M, and the average valence of L and M is approximately 3, which tends to enable the maintenance of high resistance, to inhibit the production of nitrides (heterogenous phases of L or M), and to facilitate the maintenance of the wurtzite structure as the crystal structure of aluminum nitride. When y is within the numerical range described above, the electromechanical coupling factor tends to be larger, and the stiffness tends to be smaller than for conventional AlN. However, even if y deviates from the numerical range described above, the effect of the present disclosure may still be achieved. The value of (1−y)/y may not be less than 0.8 and not more than 1.5. When (1−y)/y is between 0.8 and 1.5, a charge balance is achieved between L and M, and the average valence of L and M tends to be 3, which tends to enable the maintenance of high resistance, to inhibit the production of nitrides (heterogenous phases of L or M), and to facilitate the maintenance of the wurtzite structure as the crystal structure of aluminum nitride. However, even if (1−y)/y deviates from the numerical range described above, the effect of the present disclosure may still be achieved.

When the aluminum nitride is represented by $Al_{1-x}(L_y M_{1-y})_x N$, x is preferably between 0.02 and 0.60, or between 0.02 and 0.50, or between 0.12 and 0.24. When x is greater than or equal to the lower limit described above, the crystal structure may be distorted, and the strength of the chemical bonds between atoms changes. As a result, the piezoelectric constant d tends to become larger and the stiffness tends to become smaller. On the other hand, when x is less than or equal to the upper limit described above, the hexagonal wurtzite structure, which is the crystal structure of the aluminum nitride, tends to stabilize so as to yield piezoelectrically with good reproducibility. When x is within the numerical range described above, the electromechanical coupling factor tends to be larger and the stiffness tends to be smaller than for conventional AlN. However, even if x deviates from the numerical range described above, the effect of the present disclosure is still achieved.

In accordance with aspects of the present disclosure, the piezoelectric thin film 2H may consist of only aluminum nitride represented by $Al_{1-x}(L_yM_{1-y})_xN$. As the content of $Al_{1-x}(L_yM_{1-y})_xN$ in the piezoelectric thin film 2H becomes larger, the electromechanical coupling factor becomes larger and the stiffness becomes smaller. When the piezoelectric thin film 2H consists of only $Al_{1-x}(L_yM_{1-y})_xN$, the electromechanical coupling factor tends to be larger and the stiffness tends to be smaller than for conventional AlN. The piezoelectric thin film 2H, according to aspects of the present disclosure, may also contain components other than $Al_{1-x}(L_yM_{1-y})_xN$. The aluminum nitride may contain other components in addition to aluminum, a monad, a tetrad or pentad, and nitrogen, however, the content of the other components in the piezoelectric thin film 2H should be small enough that the intent of the present disclosure is not diminished. By way example, other components that may be provided in the piezoelectric thin film 2H may include one or more of the following: beryllium (Be); magnesium (Mg); calcium (Ca); strontium (Sr); barium (Ba); scandium (Sc); yttrium (Y); zinc (Zn); gallium (Ga); tungsten (W); platinum (Pt); molybdenum (Mo); oxygen (O); carbon (C); and indium (In).

The piezoelectric thin film 2H may have a thickness in the range of 0.1 µm to 30 µm. Each of the first electrode 6M and the second electrode 6N may have a thickness in the range of 0.01 µm to 1 µm.

The piezoelectric thin film 2H may be formed, for example, by sputtering (co-sputtering or multi-sputtering) using a plurality of targets. The plurality of targets may include at least any one type from among aluminum, a monad, a tetrad, a pentad, and nitrogen. Aluminum nitride having the target composition can be formed by selecting and combining targets having prescribed compositions. The composition of the sputtering atmosphere also influences the composition of the aluminum nitride. The sputtering atmosphere may be, for example, nitrogen gas. The sputtering atmosphere may also be a mixed gas containing nitrogen and a noble gas, such as argon. The power (power density) applied to each of the plurality of targets is also a control factor affecting the composition and thickness of the aluminum nitride. The targets may be simple metals or alloys. For example, when the aluminum nitride of the piezoelectric thin film 2H is $Al_{1-x}(Li_yNb_{1-y})_xN$, sputtering may be performed simultaneously in the atmosphere described above using three types of targets including an AlLi alloy, an AlNb alloy, and Al alone. By performing sputtering simultaneously for these three types of targets and adjusting the power density of each target, the molar ratio of Li and Nb, or x and y, in the aluminum nitride can be controlled freely. The total pressure of the sputtering atmosphere, the differential pressure or concentration in the atmosphere, the duration of sputtering for each target, the temperature of the substrate surface on which the piezoelectric thin film 2H is formed, the substrate bias, and the like are also control factors for the composition and thickness of the aluminum nitride (piezoelectric thin film 2H). A piezoelectric thin film 2H having a prescribed shape or pattern may be formed by etching (for example, plasma etching).

The composition of the piezoelectric thin film 2H may be determined by at least any of the following analytical methods: among X-ray fluorescence (XRF); energy-dispersive X-ray spectroscopy (EDX); inductively coupled plasma mass spectrometry (ICP-MS); laser ablation inductively coupled plasma mass spectrometry (LA-ICP-MS); and electron probe microanalyzer (EPMA).

The substrate 12D may be a semiconductor substrate composed of silicon, gallium arsenide, or the like, or an insulator substrate composed of glass, ceramic, or the like. The first electrode 6M and the second electrode 6N are each comprised of metal, and may include one or more of the following materials: aluminum (Al); copper (Cu); silver (Ag); gold (Au); chromium (Cr); molybdenum (Mo); tungsten (W); tantalum (Ta); palladium (Pd); platinum (Pt); ruthenium (Ru); rhodium (Rh); and iridium (Jr). Each electrode may consist of a single layer or multiple layers.

According to aspects of this disclosure, the bulk acoustic wave filter 50 may be used in, for example, a duplexer (splitter) mounted in a mobile communication device, such as a smart phone. The bulk acoustic wave filer 50 may be one part of micro electromechanical system (MEMS). A MEMS is a device in which mechanical element parts, sensors, actuators, electronic circuits and the like are integrated on a single substrate using micro-fabrication technology.

Figure 2:
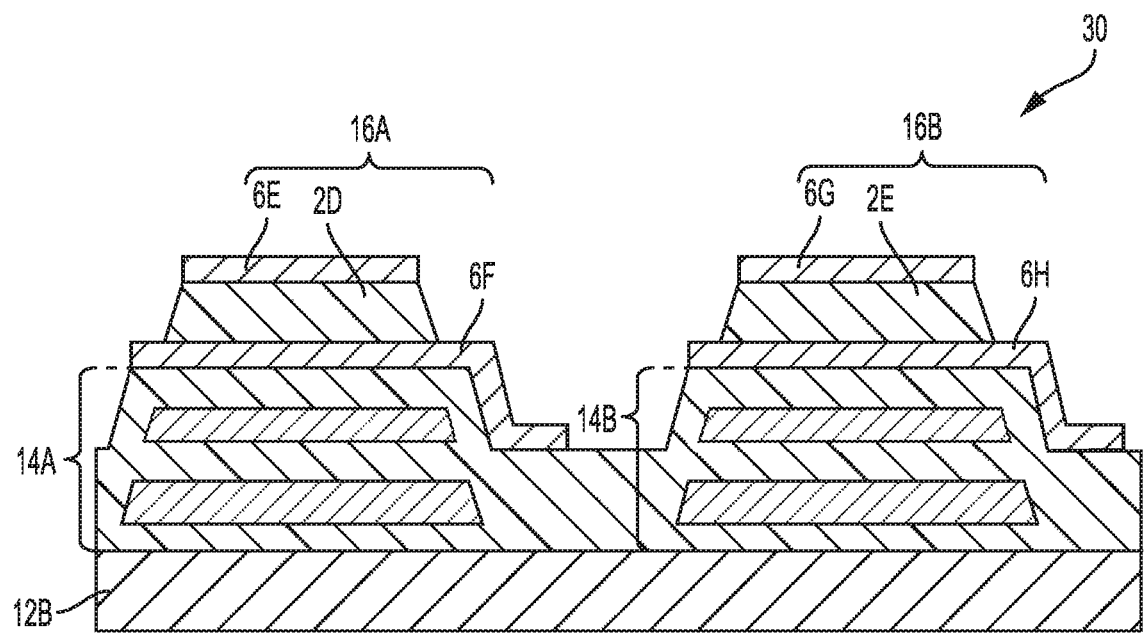
FIG. 2 is a cross-sectional view of a BAW filter according to other aspects of the present disclosure.

The present disclosure is not limited to the embodiment described above. For example, as illustrated in FIG. 2, a BAW filter 30 may include a substrate 12B, a first acoustic mirror 14A and a second acoustic mirror 14B. The first acoustic mirror 14A is disposed on the substrate 12B. The second acoustic mirror 14B is also disposed on substrate 12 and spaced apart from the first acoustic mirror 14A. The BAW filter 30 further includes a first resonator 16A mounted on the first acoustic mirror 14A, and a second resonator 16B mounted on the surface of the second acoustic mirror 14B. The BAW filter 30 is a solid mounted resonator (SMR) type filter. The first resonator 16A includes a first electrode 6E, a second electrode 6F, and a piezoelectric thin film 2D sandwiched between the first electrode 6E and the second electrode 6F. Similarly, the second resonator 16B includes a first electrode 6G, a second electrode 6H, and a piezoelectric thin film 2E sandwiched between the first electrode 6G and the second electrode 6H.

In each of the first acoustic mirror 14A and the second acoustic mirror 14B, a plurality of first impedance layers having a high acoustic impedance and a plurality of second impedance layers having a low acoustic impedance are laminated alternately. The first acoustic mirror 14A and the second acoustic mirror 14B are each an acoustic multilayer film that reflects acoustic waves. The BAW filter 30 may be a part of a MEMS.

The piezoelectric thin films 2D and 2E may contain a plurality of piezoelectric layers, and at least one of the plurality of piezoelectric layers may include aluminum nitride containing a monad and at least one type from among a tetrad and a pentad. Each of the plurality of piezoelectric layers may include aluminum nitride containing a monad and at least one type from among a tetrad and a pentad. The composition of the aluminum nitride of each piezoelectric layer may be the same as or different from the aluminum nitride in another piezoelectric layer.

A support layer (not shown) may be provided between the first electrode 6E, 6G and the respective piezoelectric thin film 2D, 2E. A support layer may also be provided between the second electrode 6F, 6H and the respective piezoelectric thin film 2D, 2E. When the piezoelectric thin film is formed on the surface of the support layer, the adhesion of the piezoelectric thin film to the first electrode or the second electrode may improve, or the support layer may enhance the piezoelectric characteristics of the piezoelectric thin film. The support layer may be composed of a substance similar to that of the piezoelectric thin film and the electrodes in terms of composition or crystal structure. The support layer may be made of a piezoelectric substance, a metal, a polymer, or a ceramic. The support layer may also be referred to as a buffer layer or an intermediate layer.

Aspects of the present disclosure will be described in further detail using working examples and comparative examples, however, but the disclosure is no way limited by these examples.

Working Example 1

A substrate made of a silicon monocrystal was provided. The silicon substrate had a thickness of 725 μm. A second electrode, composed of tungsten, was formed over the entire surface of a substrate by sputtering in a vacuum chamber.

A piezoelectric thin film was formed over the entire surface of the second electrode by simultaneously sputtering a plurality of targets in the vacuum chamber. The sputtering targets included an AlLi alloy, an AlNb alloy, and Al alone. The temperature of the substrate during the piezoelectric thin film forming process (film forming temperature) was maintained at 300° C. The atmosphere in the vacuum chamber during the piezoelectric thin film forming process was a mixture of argon and nitrogen gasses. The air pressure of the mixed gas in the vacuum chamber was adjusted to 0.30 Pa. The substrate bias during the piezoelectric thin film forming process was 0 W. The thickness of the piezoelectric thin film was adjusted to 1.3 μm.

The composition of the piezoelectric thin film was analyzed by X-ray fluorescence (XRF) and laser ablation inductively coupled plasma mass spectrometry (LA-ICP-MS). An analyzer (ZSX-100e) manufactured by the Rigaku Corporation was used in the XRF. An analyzer (7500s) manufactured by the Agilent Corporation was used in the LA-ICP-MS. As a result of analysis, the composition of the piezoelectric thin film of Working Example 1 was aluminum nitride represented by chemical formula 1 shown in Table 1 of FIG. 3. The element L, the element M and the values x and y in chemical formula 1 were respectively those shown in Table 1 of FIG. 3.

After the formation of the piezoelectric thin film, a first electrode was formed over the entire surface of the piezoelectric thin film by sputtering in a vacuum chamber. The first electrode was composed of silver.

As a result of the steps described above, a laminate including a substrate, a second electrode overlapping with the substrate, a piezoelectric thin film overlapping with the second electrode, and a first electrode overlapping with the piezoelectric thin film was produced. Next, the laminate structure on the substrate was patterned by photolithography. The entire laminate was then cut by dicing.

As a result of the steps described above, a BAW filter (resonator) of Working Example 1 with a square shape was obtained. The BAW filter included a substrate, a second electrode overlapping with the substrate, a piezoelectric thin film overlapping with the second electrode, and a first electrode overlapping with the piezoelectric thin film.

The following measurements and evaluations were performed using the piezoelectric thin film and the BAW filter of Working Example 1.

The piezoelectric constant $d_{33}$ of the piezoelectric thin film of Working Example 1 was measured using a $d_{33}$ meter (ZJ-4B) manufactured by the Chinese Academy of Sciences at a frequency of 110 Hz and clamp pressure of 0.25 N. The Piezoelectric constant $d_{33}$ is preferably not less than 4.5 pC/N.

The capacity C of the BAW filter of Working Example 1 was measured using a LCR meter (4284A) manufactured by Hewlett-Packard at a frequency of 1 kHz and electric field of 1 V/V/μm.

The specific dielectric constant $\varepsilon_r$ was calculated from the measurement value of the capacity C (average value of three measurements) based on the following mathematical formula 1:

$$C = \varepsilon_0 \varepsilon_r \left(\frac{S}{d}\right) \quad (1)$$

The dielectric constant $\varepsilon_0$ in a vacuum in mathematical formula 1 is $8.854 \times 10^{-12}$ Fm$^{-1}$. Symbol S in mathematical formula 1 is the area of each of the first electrode and the second electrode. The electrode area S was 600×600 μm$^2$. Symbol d in mathematical formula 1 is the thickness (1.3 μm) of the piezoelectric thin film. The specific dielectric constant $\varepsilon_r$ was approximated as $\varepsilon_{33}$, and the piezoelectric constant $g_{33}$ was calculated from $\varepsilon_{33}$ based on $g_{33}=d_{33}/\varepsilon_{33}$. The piezoelectric constant $g_{33}$ of Working Example 1 is shown in Table 1 of FIG. 3.

The resonance frequency $f_r$ and the anti-resonance frequency $f_a$ of the BAW filter of Working Example 1 were measured using a network analyzer (N5244A) manufactured by Agilent Technologies and GS 500 μm probe (ACP40-W-GS-500) manufactured by Cascade Microtech, at a power of −10 dBm, measurement pitch of 0.25 MHz, and electrode area of 200×200 μm$^2$. The resonance frequency $f_r$ is the frequency when the impedance of a resonance circuit using the BAW filter is minimized. The anti-resonance frequency $f_a$ is the frequency when the impedance of a resonance circuit using the BAW filter is maximized. The details of the measurements of the resonance frequency $f_r$ and the anti-resonance frequency $f_a$ were as follows.

The effective electromechanical coupling factor $k_{eff}^2$ was calculated from the measurement values of the resonance frequency $f_r$ and the anti-resonance frequency $f_a$ based on mathematical formula 2 below. Both the resonance frequency $f_r$ and the anti-resonance frequency $f_a$ used in the calculation of the effective electromechanical coupling factor $k_{eff}^2$ were average values of five measurements. The effective electromechanical coupling factor $k_{eff}^2$ of Working Example 1 is shown in Table 1 of FIG. 3. The effective electromechanical coupling factor $k_{eff}^2$ is preferably not less than 8.0%.

$$k_{eff}^2 = \left(\frac{\pi}{2}\right)^2 \left(\frac{f_r}{f_a}\right)\left(\frac{f_a - f_r}{f_a}\right) \quad (2)$$

The electromechanical coupling factor $k^2$ (units: %) was calculated from the measurement values of the resonance frequency $f_r$ and the anti-resonance frequency $f_a$ based on mathematical formula 3 below. Both the resonance frequency $f_r$ and the anti-resonance frequency $f_a$ used in the calculation of the electromechanical coupling factor $k^2$ were average values of five measurements. The electromechanical coupling factor $k^2$ of Working Example 1 is shown in Table 1 of FIG. 3. The electromechanical coupling factor $k^2$ is preferably not less than 6.5%.

$$k^2 = \frac{f_a^2 - f_r^2}{f_a^2} \quad (3)$$

The stiffness c of the piezoelectric thin film of Working Example 1 was measured using a nanoindenter (ENT1100a) manufactured by Elionix, Inc., at a strain rate of 0.05 s$^{-1}$ and pushing amount of 100 nm. The stiffness c (average value of five measurements) of Working Example 1 is shown in Table 1 of FIG. 3. The stiffness c of the piezoelectric thin film is preferably not more than 370 GPa.

The piezoelectric thin film of Working Example 1 was formed with the same method as that described above with the exception that the substrate bias in the piezoelectric thin film forming process was adjusted to 30 W and that compressive stress was applied to the piezoelectric thin film. Regardless of the action of compressive stress, the piezoelectric thin film did not separate from the second electrode. Note that in Table 1 of FIG. 3, "A" listed in the column for "Resistance to compressive stress" means that, regardless of the action of compressive stress, the piezoelectric thin film did not separate from the second electrode. On the other hand, "B" listed in the column for "Resistance to compressive stress" means that the piezoelectric thin film separated from the second electrode due to the action of compressive stress.

Working Example 2

When forming the piezoelectric thin film of Working Example 2, an AlLi alloy, an AlTa alloy, and Al alone were used as sputtering targets, and the power density applied to each target was adjusted. With the exception of the piezoelectric thin film forming method, the piezoelectric thin film and the BAW filter of Working Example 2 were produced using the same method as in Working Example 1.

As a result of the same analysis as that of the case of Working Example 1, the composition of the piezoelectric thin film of Working Example 2 was the aluminum nitride represented by chemical formula 1 in Table 1 of FIG. 3. In the case of Working Example 2, the element L, the element M, and the values of x and y in the chemical formula 1 are respectively shown in Table 1 of FIG. 3. As in the case of Working Example 1, measurements and evaluations were performed on the piezoelectric thin film and the BAW filter of Working Example 2. The results of measurements and evaluations in Working Example 2 are shown in Table 1 of FIG. 3.

Working Example 3

When forming the piezoelectric thin film of Working Example 3, an AlLi alloy, an AlV alloy, and Al alone were used as sputtering targets, and the power density applied to each target was adjusted. With the exception of the piezoelectric thin film forming method, the piezoelectric thin film and the bulk acoustic wave filter of Working Example 3 were produced with the same method as in Working Example 1.

As a result of the same analysis as that of the case of Working Example 1, the composition of the piezoelectric thin film of Working Example 3 was the aluminum nitride represented by chemical formula 1 in Table 1 of FIG. 3. In the case of Working Example 3, the element L, the element M, and the values of x and y in the chemical formula 1 are respectively shown in Table 1 of FIG. 3. As in the case of Working Example 1, measurements and evaluations were performed on the piezoelectric thin film and the BAW filter of Working Example 3. The results of measurements and evaluations in Working Example 3 are shown in Table 1 of FIG. 3.

Working Example 4

When forming the piezoelectric thin film of Working Example 4, an AlLi alloy, an AlNb alloy, and Al alone were used as sputtering targets, and the power density applied to each target was adjusted. With the exception of the piezoelectric thin film forming method, the piezoelectric thin film and the bulk acoustic wave filter of Working Example 3 were produced with the same method as in Working Example 1.

As a result of the same analysis as that of the case of Working Example 1, the composition of the piezoelectric thin film of Working Example 4 was the aluminum nitride represented by chemical formula 1 in Table 1 of FIG. 3. In the case of Working Example 4, the element L, the element M, and the values of x and y in the chemical formula 1 are respectively shown in Table 1 of FIG. 3. As in the case of Working Example 1, measurements and evaluations were performed on the piezoelectric thin film and the BAW filter of Working Example 4. The results of measurements and evaluations in Working Example 4 are shown in Table 1 of FIG. 3.

Working Example 5

When forming the piezoelectric thin film of Working Example 5, an AlLi alloy, an AlZr alloy, and Al alone were used as sputtering targets, and the power density applied to each target was adjusted. With the exception of the piezoelectric thin film forming method, the piezoelectric thin film and the bulk acoustic wave filter of Working Example 5 were produced with the same method as in Working Example 1.

As a result of the same analysis as that of the case of Working Example 1, the composition of the piezoelectric thin film of Working Example 5 was the aluminum nitride represented by chemical formula 1 in Table 1 of FIG. 3. In the case of Working Example 5, the element L, the element M, and the values of x and y in the chemical formula 1 are respectively shown in Table 1 of FIG. 3. As in the case of Working Example 1, measurements and evaluations were performed on the piezoelectric thin film and the BAW filter of Working Example 5. The results of measurements and evaluations in Working Example 5 are shown in Table 1 of FIG. 3.

Working Example 6

When forming the piezoelectric thin film of Working Example 6, an AlLi alloy, an AlNb alloy, and an AlZr alloy were used as sputtering targets, and the power density applied to each target was adjusted. With the exception of the piezoelectric thin film forming method, the piezoelectric thin film and the bulk acoustic wave filter of Working Example 6 were produced with the same method as in Working Example 1.

As a result of the same analysis as that of the case of Working Example 1, it was confirmed that the piezoelectric thin film of Working Example 6 was made of only $Al_{0.88}(Li_{0.40}Nb_{0.5\times0.6}Zr_{0.5\times0.6})_{0.12}N$. That is, in the case of Working Example 6, the element L, the element M, and the values of x and y in the chemical formula 1 are respectively shown in Table 1 of FIG. 3. As in the case of Working Example 1, measurements and evaluations were performed on the piezoelectric thin film and the BAW filter of Working Example 6. The results of measurements and evaluations in Working Example 6 are shown in Table 1 of FIG. 3.

Comparative Example 1

When forming the piezoelectric thin film of Comparative Example 1, Al alone was used as a sputtering target, and the power density applied to the target was adjusted. With the exception of the piezoelectric thin film forming method, the piezoelectric thin film and the bulk acoustic wave filter of Comparative Example 1 were produced with the same method as in Working Example 1.

As a result of the same analysis as that of the case of Working Example 1, it was confirmed that the piezoelectric thin film of Comparative Example 1 was made of only AlN. As in the case of Working Example 1, measurements and evaluations were performed on the piezoelectric thin film and the BAW of Comparative Example 1. The results of measurements and evaluations in Comparative Example 1 are shown in Table 1 of FIG. 3.

Comparative Example 2

When forming the piezoelectric thin film of Comparative Example 2, an AlMg alloy, an AlZr alloy, and Al alone were used as sputtering targets, and the power density applied to each target was adjusted. With the exception of the piezoelectric thin film forming method, the piezoelectric thin film and the BAW filter of Comparative Example 2 were produced with the same method as in Working Example 1.

As a result of the same analysis as that of the case of Working Example 1, it was confirmed that the piezoelectric thin film of Comparative Example 2 was made of only $Al_{0.88}(Mg_{0.5}Zr_{0.5})_{0.12}N$. As in the case of Working Example 1, measurements and evaluations were performed on the piezoelectric thin film and the BAW filter of Comparative Example 2. The results of measurements and evaluations in Comparative Example 2 are shown in Table 1 of FIG. 3.

Comparative Example 3

When forming the piezoelectric thin film of Comparative Example 3, an AlLi alloy and Al alone were used as sputtering targets, and the power density applied to each target was adjusted. With the exception of the piezoelectric thin film forming method, the piezoelectric thin film and the BAW filter of Comparative Example 3 were produced with the same method as in Working Example 1.

As a result of the same analysis as that of the case of Working Example 1, it was confirmed that the piezoelectric thin film of Comparative Example 3 was made of only $Al_{0.88}Li_{0.12}N$. Since the electrical resistivity of the piezoelectric thin film of Comparative Example 3 was too low, it was not possible to calculate the values of $d_{33}$, $g_{33}$, $k_{eff}^2$, and $k^2$ of Comparative Example 3. That is, the piezoelectric thin film of Comparative Example 3 did not have practical piezoelectric characteristics in the first place. In the case of Comparative Example 3, the measurement of the stiffness c and the evaluation of resistance to compressive stress were not performed.

Comparative Example 4

When forming the piezoelectric thin film of Comparative Example 4, an AlNb alloy and Al alone were used as sputtering targets, and the power density applied to each target was adjusted. With the exception of the piezoelectric thin film forming method, the piezoelectric thin film and the BAW filter of Comparative Example 4 were produced with the same method as in Working Example 1.

As a result of the same analysis as that of the case of Working Example 1, it was confirmed that the composition of the piezoelectric thin film of Comparative Example 4 was made of only $Al_{0.88}Nb_{0.12}N$. Since the electrical resistivity of the piezoelectric thin film of Comparative Example 4 was too low, it was not possible to calculate the values of $d_{33}$, $g_{33}$, $k_{eff}^2$, and $k^2$ of Comparative Example 3. That is, the piezoelectric thin film of Comparative Example 4 did not have practical piezoelectric characteristics in the first place. In the case of Comparative Example 4, the measurement of the stiffness c and the evaluation of resistance to compressive stress were not performed.

What is claimed is:

1. A piezoelectric thin film comprising aluminum nitride containing a monad and at least one type from among a tetrad and a pentad.

2. The piezoelectric thin film according to claim 1, wherein the aluminum nitride contains at least one type selected from the group consisting of vanadium, niobium, and tantalum as the pentad.

3. The piezoelectric thin film according to claim 2, wherein the aluminum nitride contains at least one type from among zirconium and hafnium as the tetrad.

4. The piezoelectric thin film according to claim 1, wherein the aluminum nitride contains at least one type from among zirconium and hafnium as the tetrad.

5. A bulk acoustic wave filter comprising:
a substrate;
a piezoelectric thin film disposed on the substrate, the piezoelectric thin film including aluminum nitride containing a monad and at least one type from among a tetrad and a pentad; and
a pair of electrodes,
wherein the piezoelectric thin film is disposed between the pair of electrodes.

6. The bulk acoustic wave filter according to claim 5, wherein the aluminum nitride contains at least one type selected from the group consisting of vanadium, niobium, and tantalum as the pentad.

7. The bulk acoustic wave filter according to claim 6, wherein the aluminum nitride contains at least one type from among zirconium and hafnium as the tetrad.

8. The bulk acoustic wave filter according to claim 5, wherein the aluminum nitride contains at least one type from among zirconium and hafnium as the tetrad.

9. The bulk acoustic wave filter according to claim 5, further comprising an acoustic mirror on the substrate, wherein the piezoelectric thin film and the pair of electrodes form a resonator, and the resonator is disposed on the acoustic mirror.

10. The bulk acoustic wave filter according to claim 9, further comprising: a second acoustic mirror on the substrate; and a second resonator disposed on the second acoustic mirror, wherein the second acoustic mirror is spaced apart from the first acoustic mirror.

* * * * *